(12) United States Patent
In et al.

(10) Patent No.: US 7,457,911 B2
(45) Date of Patent: Nov. 25, 2008

(54) NONVOLATILE MEMORY DEVICE AND METHOD FOR STORING STATUS INFORMATION USING MULTIPLE STRINGS

(75) Inventors: Ji-hyun In, Seoul (KR); Kwang-yoon Lee, Seongnam-si (KR); Song-ho Yoon, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 11/385,804

(22) Filed: Mar. 22, 2006

(65) Prior Publication Data

US 2006/0215454 A1 Sep. 28, 2006

(30) Foreign Application Priority Data

Mar. 25, 2005 (KR) .................... 10-2005-0024970

(51) Int. Cl.
*G11C 16/04* (2006.01)
*G11C 16/02* (2006.01)

(52) U.S. Cl. ...................................... 711/103

(58) Field of Classification Search ................ 711/156, 711/154, 104, 103, 106, 105; 365/185.17, 365/185.07
See application file for complete search history.

(56) References Cited

U.S. PATENT DOCUMENTS 5,524,094 A * 6/1996 Nobukata et al. ...... 365/185.21
5,603,001 A 2/1997 Sukegawa et al.
6,118,696 A * 9/2000 Choi ...................... 365/185.11
6,806,518 B2 10/2004 Kim et al.
2003/0076719 A1 4/2003 Byeon et al.
2004/0170056 A1 9/2004 Shibata et al.

FOREIGN PATENT DOCUMENTS

| EP | 0782146 A2 | 7/1997 |
| EP | 0952554 A2 * | 10/1999 |
| JP | 06-215584 A | 8/1994 |
| JP | 2003-109384 A | 4/2003 |
| KR | 10-2004-0067856 A | 7/2004 |

* cited by examiner

*Primary Examiner*—Pierre-Michel Bataille
(74) *Attorney, Agent, or Firm*—Sughrue Mion, PLLC

(57) ABSTRACT

A nonvolatile memory device and method for storing status information using multiple strings are provided. The nonvolatile memory device and method allow the status information to be stored using multiple strings. The nonvolatile memory includes a cell capable of storing at least one bit of data, a plurality of strings in each of which at least two cells are connected in series, and a plurality of pages each of which includes a plurality of cells, wherein the strings comprise a main string group comprised of strings storing data and a spare string group including at least two spare strings that store status information on the data stored in the main string group.

23 Claims, 14 Drawing Sheets

NONVOLATILE MEMORY DEVICE AND METHOD FOR STORING STATUS INFORMATION USING MULTIPLE STRINGS

CROSS-REFERENCE TO RELATED APPLICATIONS

This application claims priority from Korean Patent Application No. 10-2005-0024970 filed on Mar. 25, 2005 in the Korean Intellectual Property Office, the disclosure of which is incorporated herein by reference in its entirety.

BACKGROUND OF THE INVENTION

1. Field of the Invention

The present invention relates to a nonvolatile memory device and method for storing status information using a plurality of strings.

2. Description of the Related Art

The development of multimedia technology has led to a tendency of using a large amount of data. In addition, with the diversification of devices such as digital cameras, digital camcorders, and digital recorders requiring storage of multimedia data, interest in nonvolatile memory devices storing multimedia device is increasing. Nonvolatile memory devices include memory devices such as NAND flash memory devices requiring an erase operation to be performed before a write operation.

Usually, memory has a value of "1" or "0" according to existence or nonexistence of charges in a particular area. These memory elements constitute a single memory device. Meanwhile, input/output can be performed in memory in various ways. Multi-level cell memory is comprised of multi-level cells. Here, "multi-level" indicates that multiple levels of charges exist in each cell. For example, when there are four levels 0 through 3of a charge status, level 0 indicates that no charges exist; level 1 indicates that charges of V1 or lower voltage are stored; level 2 indicates that charges are stored between V1 and V2; and level 3 indicates that charges are fully stored at V2. A multi-level cell can store at least one bit of information. A cell is a single unit of storing data. Diverse flash memory devices are provided according to the connection relationship between cells and an input/output unit or erase unit constituted by cells.

A flash memory device is an electrically erasable and programmable nonvolatile memory device and has advantages of low power consumption and small volume. However, an erase operation must be performed first to store data in flash memory. As a result, two types of status, i.e., an erased status and a nonerased status, exist. A unit (or a block) erased at a time may be greater than a unit (or a page) stored at a time. Flash memory is a name created to indicate that a single block is erased at a time.

FIG. 1 illustrates an organization of a conventional NAND flash memory. A cell 100 is a minimum unit for storing information. A string 310 is comprised of cells connected in series. The cell 100 includes a control gate, a floating gate, a source, and a drain. Anions may be accumulated at the floating gate and accumulation status is defined as "0" or "1." A word line (WL) is a unit group of control gates of multiple cells. A WL is a page unit in the NAND flash memory and allows a page to be selected when data is input or output. Information of a cell in a page may be a single bit and may be read or programmed through a bit line (BL). A string selection line (SSL), a ground selection line (GSL), and a common source line (CSL) are used to control cells when data is written to or read from a cell or when all data in a block is erased.

FIG. 2 illustrates the diagrammatized structure of the flash memory illustrated in FIG. 1. Cells illustrated in FIG. 1 are represented by circles and a line is connected between circles to represent that the cells are connected in a string.

As described above, a block 500 is a unit erased at a time in flash memory. Pluralities of blocks are included in the flash memory. The block 500 includes a plurality of strings 310, 320, 330 in which a plurality of cells are connected in series. In NAND or AND flash memory, as illustrated in FIG. 1, a drain of a first cell is connected to a source of a second cell. Such connection is made among a plurality of cells.

Each of pages 210 and 220 is another element included in the block 500 and corresponds to a WL illustrated in FIG. 1. Each of the pages 210 and 220 is a unit for the input and output of data. Each page 210 or 220 is comprised of cells at the same position in different strings. For example, the page A 210 is comprised of first cells in the strings 310 and 330. The page B 220 is comprised of third cells in the strings 310 and 330. In flash memory, each cell can store at least one bit of information. Data is written (or programmed) in units of pages and an erase operation is required before the data is written. Here, data is erased in units of blocks. As illustrated in FIGS. 1 and 2, the strings 310, 320, and 330 are sets of connected cells. Accordingly, when data is programmed to the page A 210, other cells included in the same strings as cells of the page A 210 may be influenced.

FIG. 3 illustrates the structure of the conventional NAND flash memory. The NAND flash memory includes a plurality of blocks each of which is like the block 500 shown in FIG. 2. Each block includes a plurality of pages. Each page includes a main string group comprised of main strings and a spare string group comprised of spare strings. A cell in a main string group constructs at least one sector. The spare string group is a space, in which data is not currently stored, and is reserved to store data later or to replace a cell having an error. Usually, the number of bits having an error per one page is the number of cells having an error in both of the main string group and the spare string group. A page is a unit for logical input/output and a string is a group of physical cells.

FIG. 4 illustrates a case where when a particular cell is programmed in the conventional flash memory, other cells in the same string as the particular cell are influenced. A first cell 110 is programmed to store data in the page A 210. Here, a second cell 120 included in the same string (i.e., a string 310) as the first cell 110 may also be programmed. In detail, 3.3 V is applied to a BL2 and 18 V is applied to the page A 210 including a cell in which data is to be stored. Since 18 V is applied to a control gate of the first cell 110 and 3.3 V is applied to a BL2, negative charges (i.e., anions) in a source of the first cell 110 are accumulated at a floating gate of the first cell 110 while moving to a drain of the first cell 110. Originally, it is supposed that anions are not accumulated at the second cell 120 included in the page B 220. However, while charges are moving, anions may be accumulated at the second cell 120. As a result, the second cell 120 in the page B 220 may be unexpectedly programmed as 1 or 0.

In this case, unexpected data disturbance occurs. Here, since the second cell 120 is included in the page B 220, the page B 220 is eventually programmed while the page A 210 is programmed.

Conventionally, to prevent an error from occurring because electric power is interrupted while data is being stored in a page, a method of separately storing status information indicating whether data has been normally stored in each page, after storing of the data is performed on the page, has been proposed (U.S. Pat. No. 6,549,457B1). In the method, whether data storing was successful in a particular page is known through status information, but an error occurring when the status information is stored cannot be prevented. In particular, when the status information is stored at a cell in a memory having a string structure in which other cells may be influenced when one cell is programmed, an error cannot be prevented from occurring while the status information is stored.

For example, referring to FIG. 4, a setting is made to store status information in the first string 310 corresponding to a spare string. When a value of the first cell 110 is set to 0 after data is programmed to the page A 210, whether the data has been stored in the page A 210 is known from the value of the first cell 110. However, while status information is programmed to the first cell 110, the second cell 120 may also be programmed because the first cell 110 and the second cell 120 are included in the same string 310. Accordingly, when the second cell 120 is programmed as 0, an erroneous determination may be made that data has been stored in the page B 220.

Accordingly, it is desired to prevent an error from occurring when status information is stored so that data storage status can be determined correctly. It is important to prevent an error occurring when status information is stored because the error gives wrong information about a page or a sector rather than the status information itself. In particular, it is desired to prevent incorrect status information indicating that data has been stored in irrelevant pages from being stored due to interruption of electric power.

SUMMARY OF THE INVENTION

The present invention provides a nonvolatile memory device and method for storing status information using cells in a plurality of strings.

The present invention also provides a nonvolatile memory device and method for reducing en error occurring when data is stored by preventing storing of status information in a string from influencing other strings.

The above stated aspect as well as other aspects, features and advantages, of the present invention will become clear to those skilled in the art upon review of the following description.

According to an aspect of the present invention, there is provided a nonvolatile memory for storing status information using multiple strings. The nonvolatile memory includes a cell capable of storing at least one bit of data, a plurality of strings in each of which at least two cells are connected in series, and a plurality of pages each of which includes a plurality of cells, wherein the strings include a main string group comprised of strings storing data and a spare string group including at least two spare strings that store status information on the data stored in the main string group.

According to another aspect of the present invention, there is provided a nonvolatile memory device for storing status information using multiple strings, the nonvolatile memory device including a nonvolatile storage unit comprising a cell capable of storing at least one bit of data, a plurality of strings in each of which at least two cells are connected in series, and a plurality of pages each of which includes a plurality of cells, and a memory control unit selecting a cell to store the data in the nonvolatile storage unit, wherein the memory control unit controls such that the plurality of strings comprise a main string group comprised of strings storing data and a spare string group including at least two spare strings that store status information on the data stored in the main string group.

According to still another aspect of the present invention, there is provided a method of storing status information using multiple strings, the method including receiving data and address information for storing the data, storing the data in a cell corresponding to the address information within a main string group, selecting a cell from a spare string group to store status information on a page including the cell storing the data, and storing the status information on the page in the selected cell, wherein the spare string group comprises at least two strings each of which comprises a cell storing status information on data stored in the main string group.

BRIEF DESCRIPTION OF THE DRAWINGS

The above and other features and advantages of the present invention will become more apparent by describing in detail non-limiting embodiments thereof with reference to the attached drawings in which.

DETAILED DESCRIPTION OF THE INVENTION

Figure 1:
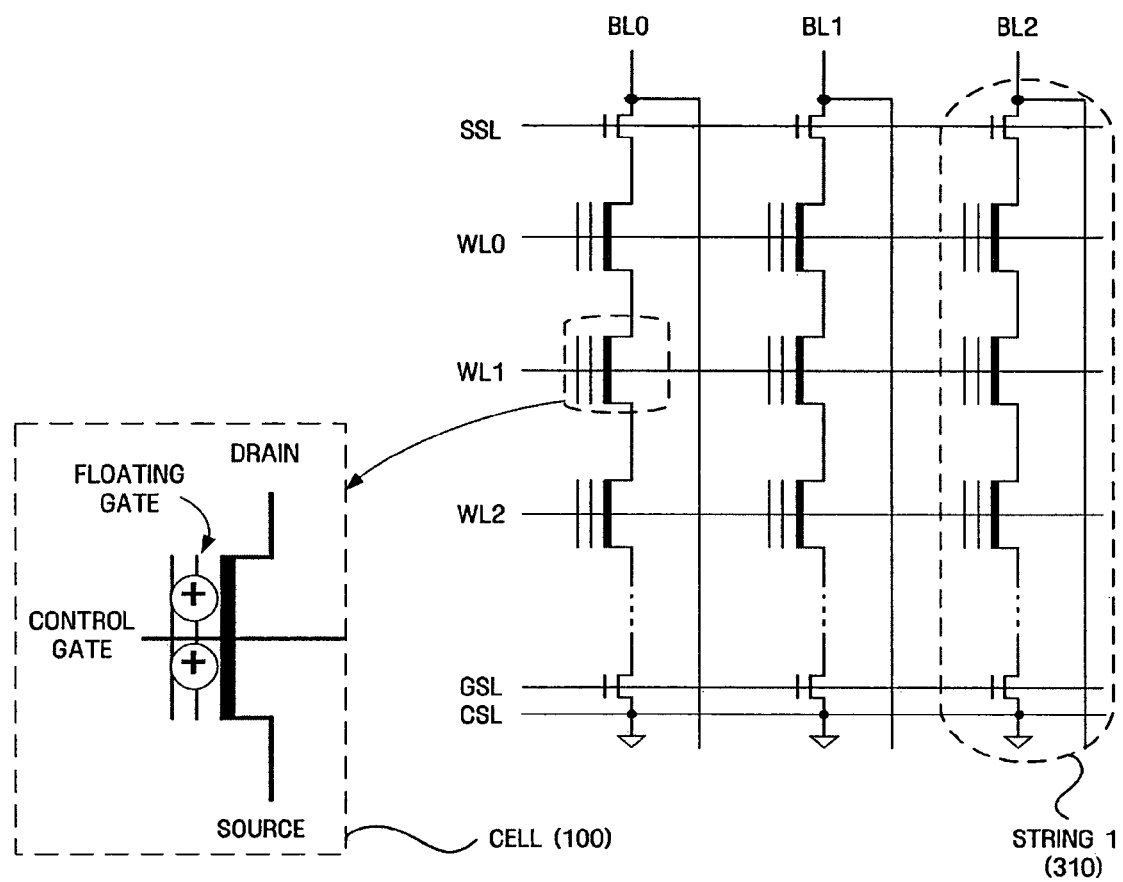
FIG. 1 illustrates a portion of conventional NAND flash memory.

The present invention will now be described more fully with reference to the accompanying drawings, in which non-limiting embodiments of this invention are shown. Advantages and features of the present invention and methods of accomplishing the same may be understood more readily by reference to the following detailed description of non-limiting embodiments and the accompanying drawings. The present invention may, however, be embodied in many different forms and should not be construed as being limited to the non-limiting embodiments set forth herein. Rather, these non-limiting embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which non-limiting embodiments of the invention are shown.

Before setting forth, terms used in the specification will be described briefly. However, it is noted that the use of any and all examples, or exemplary terms provided herein is intended merely for a better understanding of the invention and is not a limitation on the scope of the invention unless otherwise claimed.

Flash Memory

Flash memory is a sort of nonvolatile memory and holds its data even when a power supply is stopped after the data is stored. Flash memory is made in three forms: NAND flash, NOR flash, and AND flash. Flash memory is largely divided into blocks each of which includes at least two pages. Each page is divided into sectors. At least one sector is allocated to each page. In addition, each page includes a main string actually storing data and a spare string usually storing information on the page or data.

Program

Program is an operation of storing data like flash memory. A programmed cell cannot store any more data before an erase operation is performed thereon.

Small-Block Flash Memory and Large-Block Flash Memory

Flash memory in which a single sector constitutes a page is referred to as small-block flash memory. Flash memory in which a page includes at least two sectors is referred to as large-block flash memory.

Cell and String

A cell is a unit element storing information and may be implemented using diverse transistors such as an NMOS transistor, a PMOS transistor, and a CMOS transistor. A cell can usually store at least one bit of information. As described with reference to FIG. 1, whether data has been stored in a cell is expressed by indicating whether negative or positive charges are present in a floating gate of the cell. A string is a set of cells connected such that a source of a cell is connected to a drain of a subsequent cell. A page provides information by taking a single cell among a plurality of cells included in different strings, respectively. A page gathers particular cells (for example, cells at a particular position) in a plurality of strings. In conventional flash memory, a unit applying the same electric power to control gates of multiple cells is referred to as a page.

In non-limiting embodiments of the present invention, in flash memory including a plurality of cells in a plurality of strings, status information may be stored in a single cell per one string or may be duplicately stored in cells of at least two respective strings, an error detected, and whether data has been stored successfully is determined.

Figure 5:
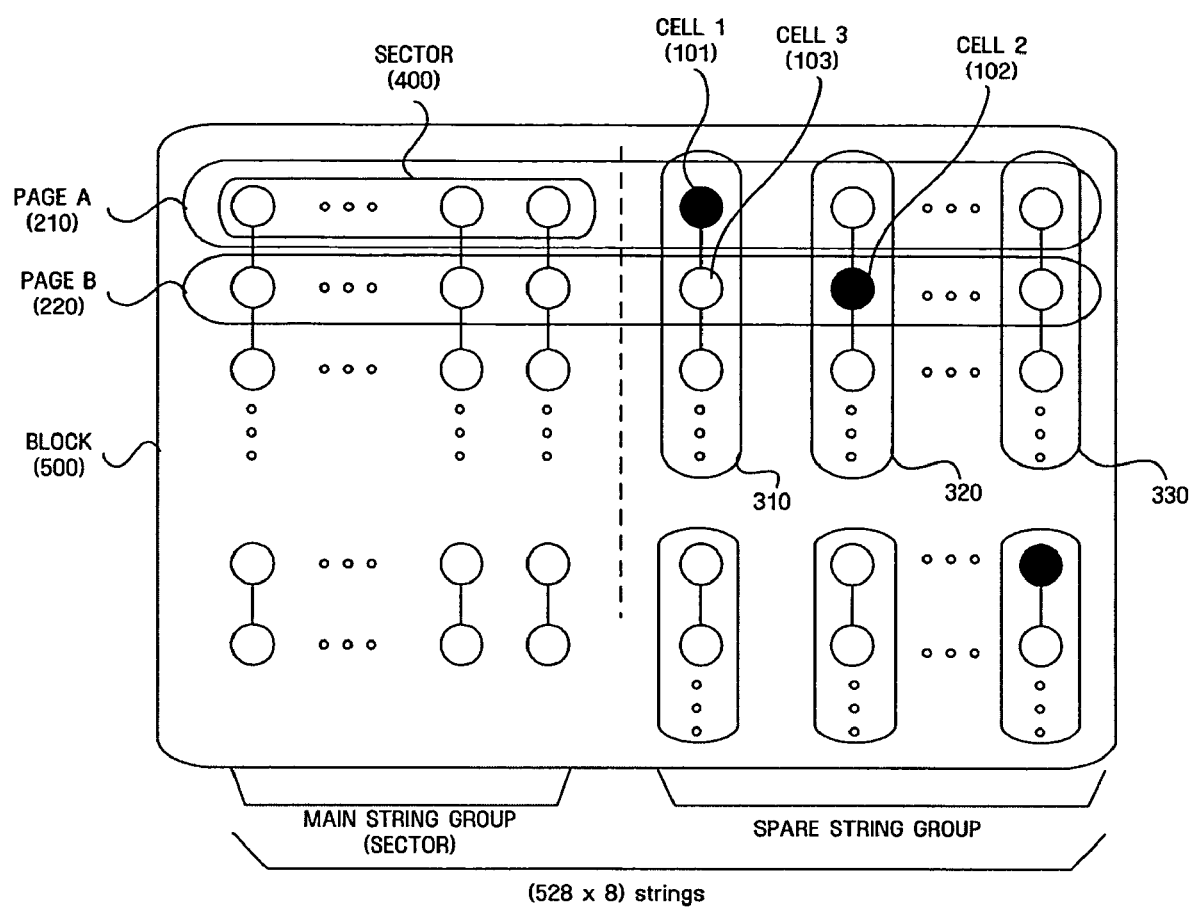
FIG. 5 illustrates small-block flash memory in which a single cell is used in one string to eliminate an error occurring when data is programmed, according to a non-limiting embodiment of the present invention.

FIG. 5 illustrates small-block flash memory in which a single cell is used in one string to eliminate an error occurring when data is programmed, according to a non-limiting embodiment of the present invention.

Figure 3:
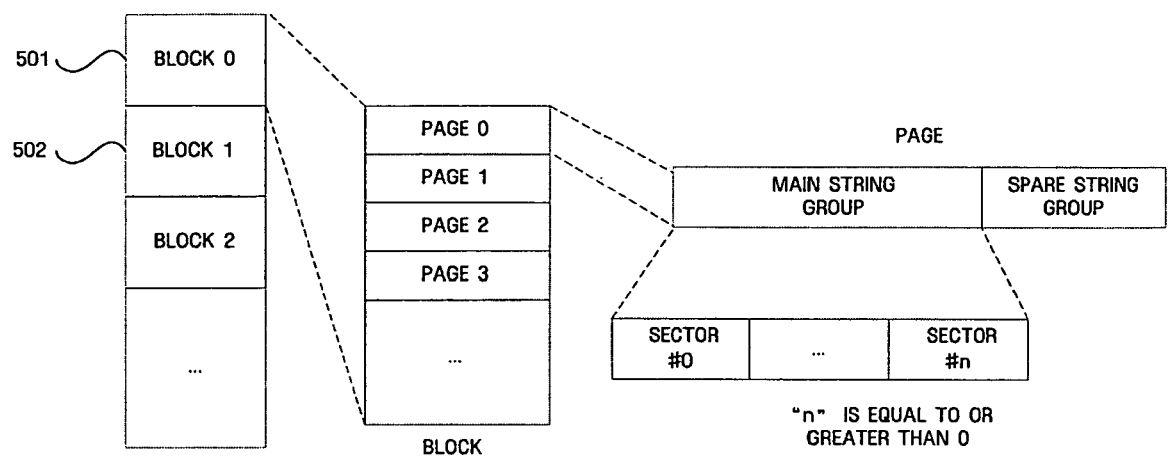
FIG. 3 illustrates the structure of the conventional NAND flash memory.
Figure 4:
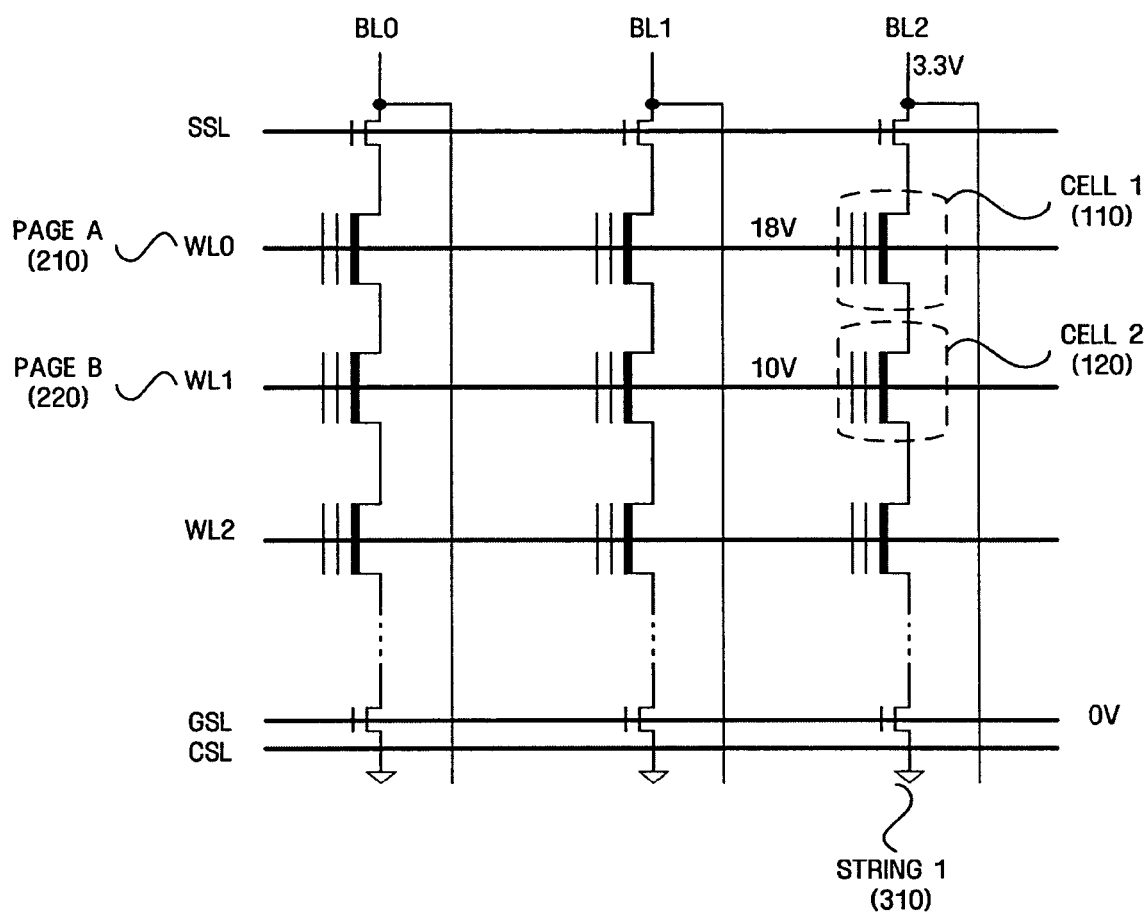
FIG. 4 illustrates a case where when a particular cell is programmed in the conventional flash memory, other cells in the same string as the particular cell are influenced.

In the small-block flash memory, a single sector constitutes a page. As described with reference to FIG. 3, a single page includes cells included in a main string group and cells included in a spare string group. Cells included in the main string group constitute a sector 400. A single cell may contain at least one bit of information. In FIG. 5, a single cell corresponds to one bit. Page A 210 includes the sector 400 and cells included in a plurality of spare strings. When data is stored in one page (or sector), status information indicating whether the data has been successfully stored in the page or sector is stored in a cell of a spare string. Here, it is predefined that a cell storing status information on one page is not present in the same spare string as a cell storing status information on another page is. As a result, when status information is stored in a cell of a string, it can be prevented that incorrect information on a page is provided due to an error occurring when other cells of the string are changed.

Assumption is made that status information of 1 indicates that a corresponding sector has been initialized and status information of 0 indicates that a corresponding sector has been programmed. Status information indicating whether data has been successfully programmed to the sector 400 of the page A 210 may be stored in a cell 101 of a string 310. The status information is stored by changing a value of the cell 101 into "0." In addition, when data is programmed to a sector of page B 220, status information may be stored in a cell 102 of a string 320. The cell 102 also has a value of 0. As a result, even when a power supply is interrupted or an additional operation is performed thereafter, it can be seen from the cell 101 that data has been stored in the page A 210 and it can be seen from the cell 102 that data has been stored the page B 220.

When status information is stored in the manner illustrated in FIG. 5, an error does not occur in the status information although programming a cell in a string may influence other cells in the string. In other words, when the status information on the page A 210 is stored in the cell 101, other cells in the string 310 may be influenced. However, as described above, since it is predefined that a single string contains status information on only one sector, status information error does not occur.

That is, it is considered that the status information on the page A 210 is stored in the cell 101 and the status information on the page B 220 is stored in the cell 102. Accordingly, even when a cell 103 included in the string 310 is influenced when the status information on the page A 210 is stored in the cell 101 included in the string 310, and erroneously represents that data has been stored in the page B 220, status information error does not occur. The status information error does not occur because only the cell 102 is referred to for the status information on the page B 220 according to the predefinition that a single string contains status information on only one sector in the embodiment of the present invention.

Figure 6:
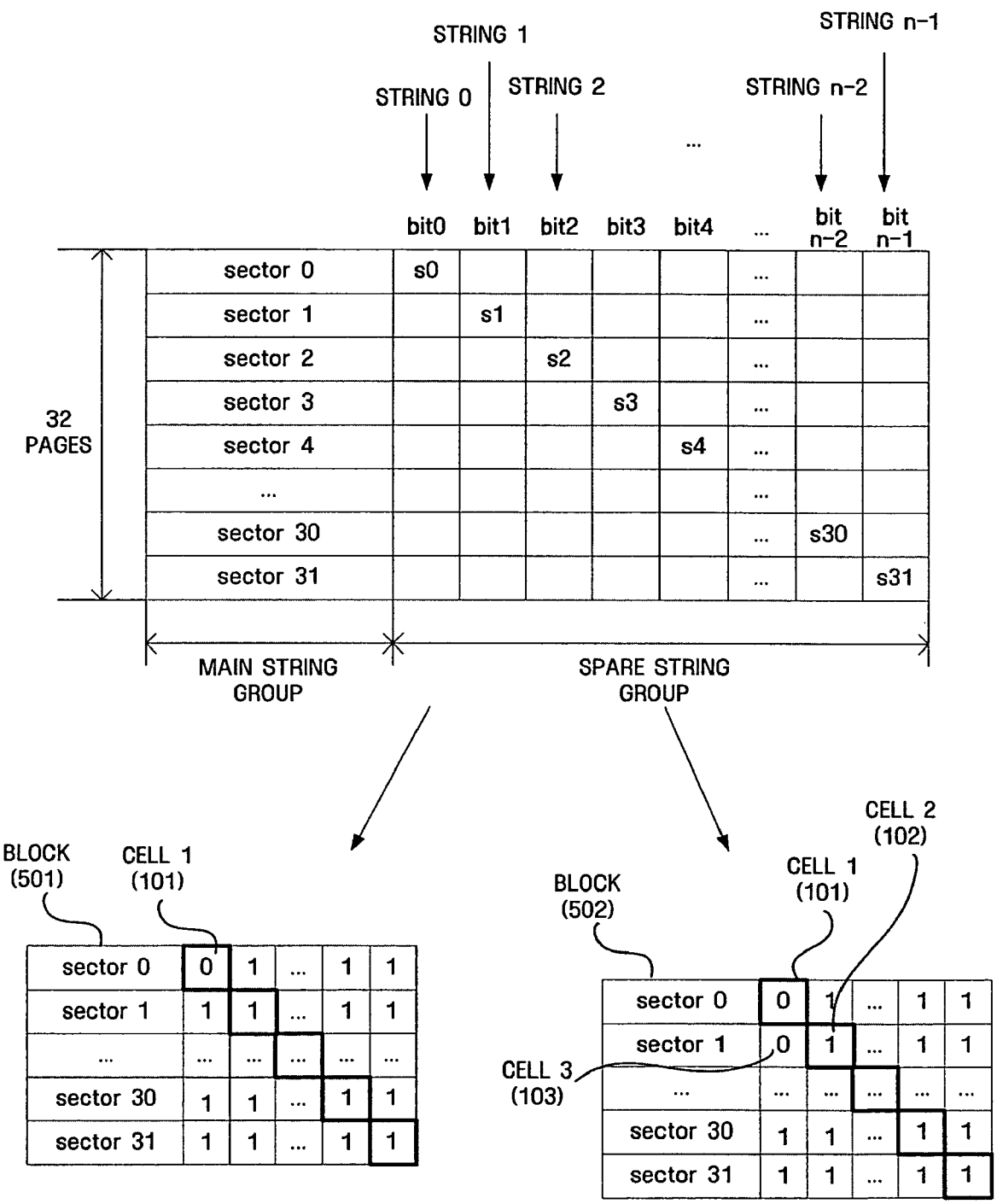
FIG. 6 illustrates a block in a table form in which a cell corresponds to a cell in a spare string in the small-block flash memory illustrated in FIG. 5.

FIG. 6 illustrates a block in a table form in which a cell corresponds to a cell in a spare string in the small-block flash memory illustrated in FIG. 5. Status information on sector 0 is stored in bit 0 (i.e., s0) of string 0. Status information on sector 1 is stored in bit 1 (i.e., s1) of string 1. In this way, status information on sector 1 through 31 is stored. Bits 0 through n−1 in which status information is stored are included in different strings, respectively, and therefore, when status information is stored in a particular bit, other status information is not changed. An error does not occur in the status information, and therefore, whether an error has occurred in a page or sector can be provided correctly.

A block 501 shows a case where the sector 0 is programmed without an error. In the block 501, cells represented by bold-outlined boxes on a diagonal store status information. A numerical value in each box indicates status information on a corresponding sector. The sector 0 is programmed and the cell 101 in a first string, i.e., the string 0 is changed into "0."

A block 502 shows a case where a value of the cell 103 is changed when the status information on the sector 0 is stored in the cell 101. However, the change in the value of the cell 103 can be ignored because it is predefined that status information on sector 1 is stored in the cell 102.

Figure 2:
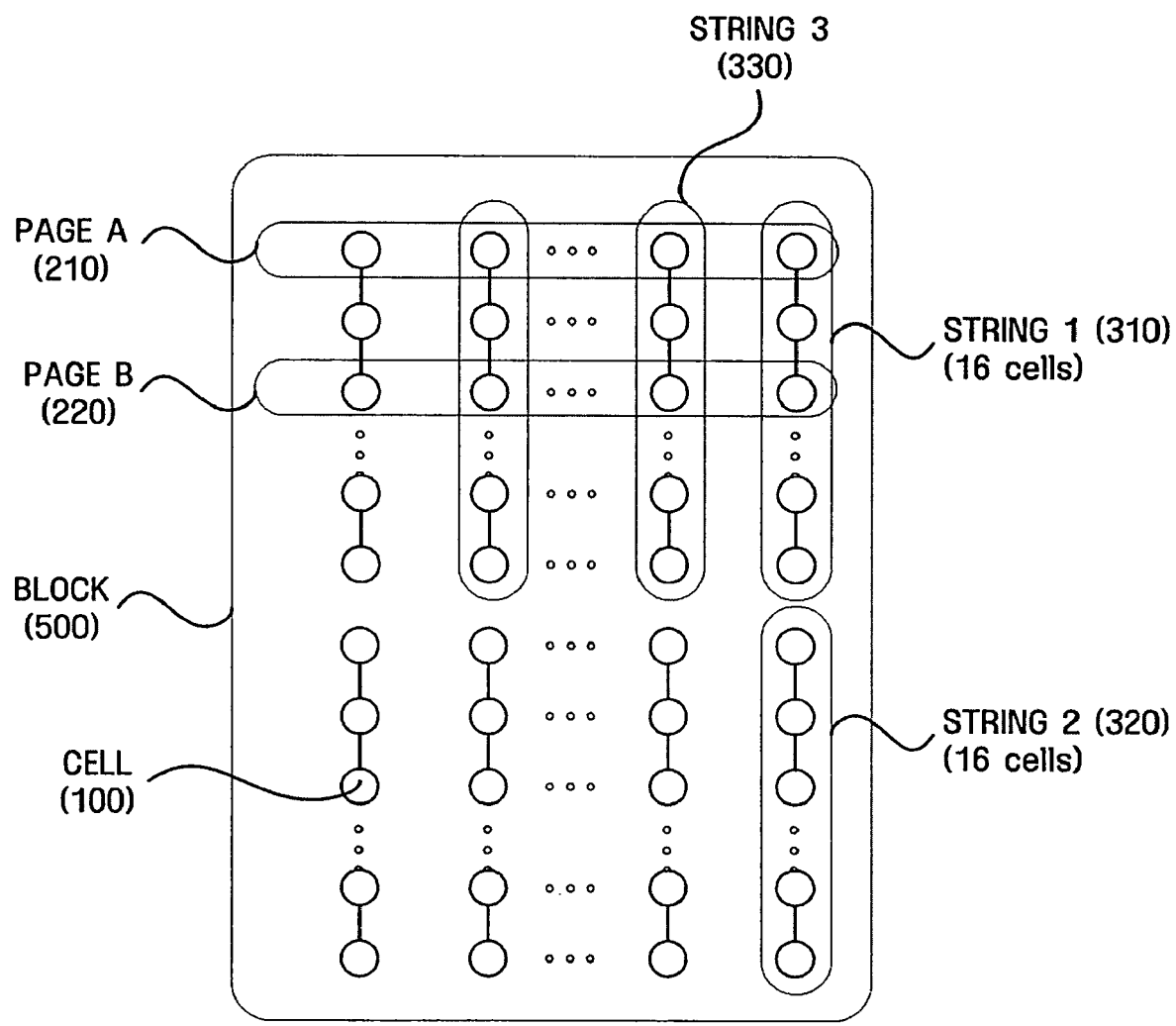
FIG. 2 illustrates the diagrammatized structure of the flash memory illustrated in FIG. 1.

When a single string represents a bit of information and a single page contains 528 bytes of information, 516 bytes are used to store real data and the remaining 16 bytes are reserved as a spare space in the page. Here, a total of 16×8=128 strings is present in the spare space. Accordingly, when a single string includes a total of 32 cells in FIG. 5, 32 strings among the 128 strings may be used to store status information. The number of strings present in the spare space may be different according to the number of cells included in each string. For example, a single string may include 16 cells, as illustrated in FIG. 2, or may include 32 cells. According to the number of cells included in a single string, the number of cases considered to avoid duplication is different.

Figure 7:
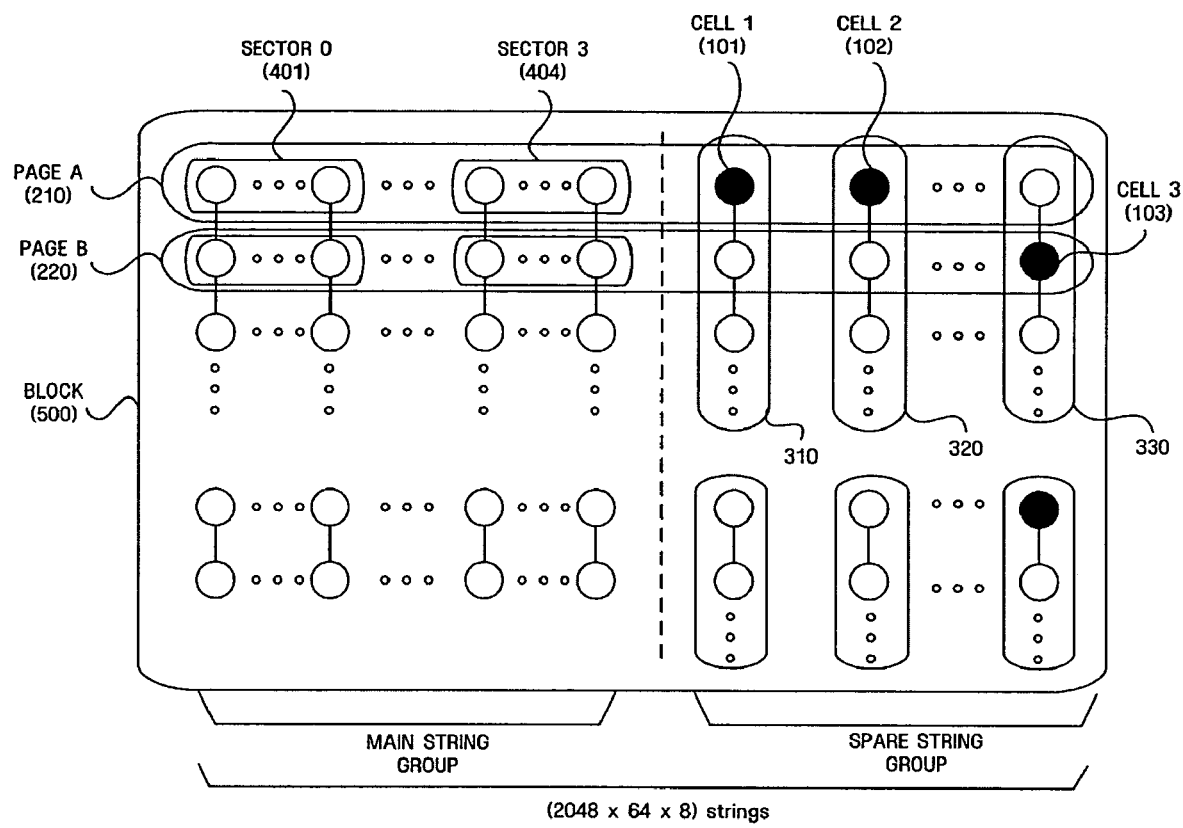
FIG. 7 illustrates large-block flash memory in which a single cell is used in one string to eliminate an error occurring when data is programmed, according to a non-limiting embodiment of the present invention.

FIG. 7 illustrates large-block flash memory in which a single cell is used in one string to eliminate an error occurring when data is programmed, according to a non-limiting embodiment of the present invention.

A block 500 includes 64 pages each of which includes four sectors. A single string includes 32 cells. Since each page includes 4 sectors, a total of four bits are needed to store status information for the individual sectors of the page. Status information on a first sector 401, i.e., sector 0 of page A 210, is stored in a cell 101 positioned at a first place in a string 310. Status information on a second sector of the page A 210 is stored in a cell 102 positioned at a first place in a string 320.

Figure 8:
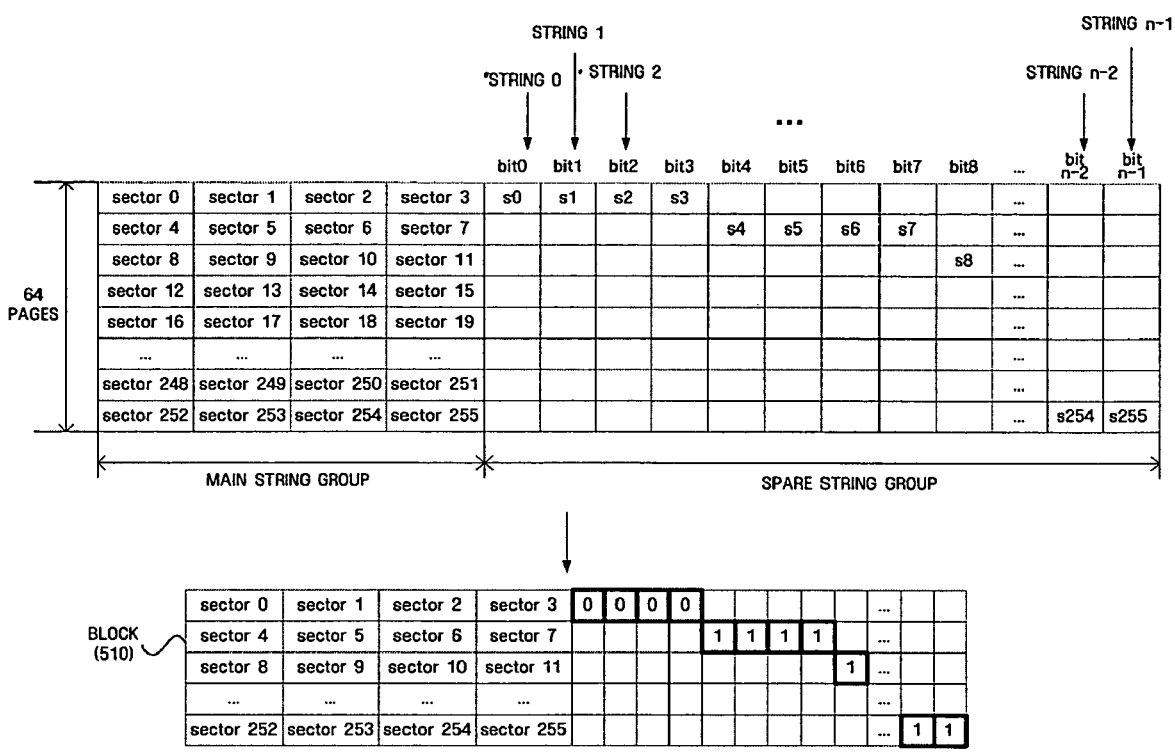
FIG. 8 illustrates a block in a table form in which a cell corresponds to a cell in a spare string in the large-block flash memory illustrated in FIG. 7.

FIG. 8 illustrates a block in a table form in which a cell corresponds to a cell in a spare string in the large-block flash memory illustrated in FIG. 7. Status information on sector 0 is stored in bit 0 (i.e., s0) of string 0. Status information on sector 1 is stored in bit 1 (i.e., s1) of string 1. In this way, status information on sector 1 through 255 is stored. Bits 0 through n−1 in which the status information is stored are included in different strings, respectively, and therefore, when status information is stored in a particular bit, other status information is not changed. An error does not occur in the status information, and therefore, whether an error has occurred in a page or sector can be provided correctly. In a block 510, data has been programmed to sectors 0 through 3. Cells storing status information are represented by bold-outlined boxes. Since only one cell in one string represents status information, the status information is not incorrectly provided even when other cells in the same string change.

Figure 9:
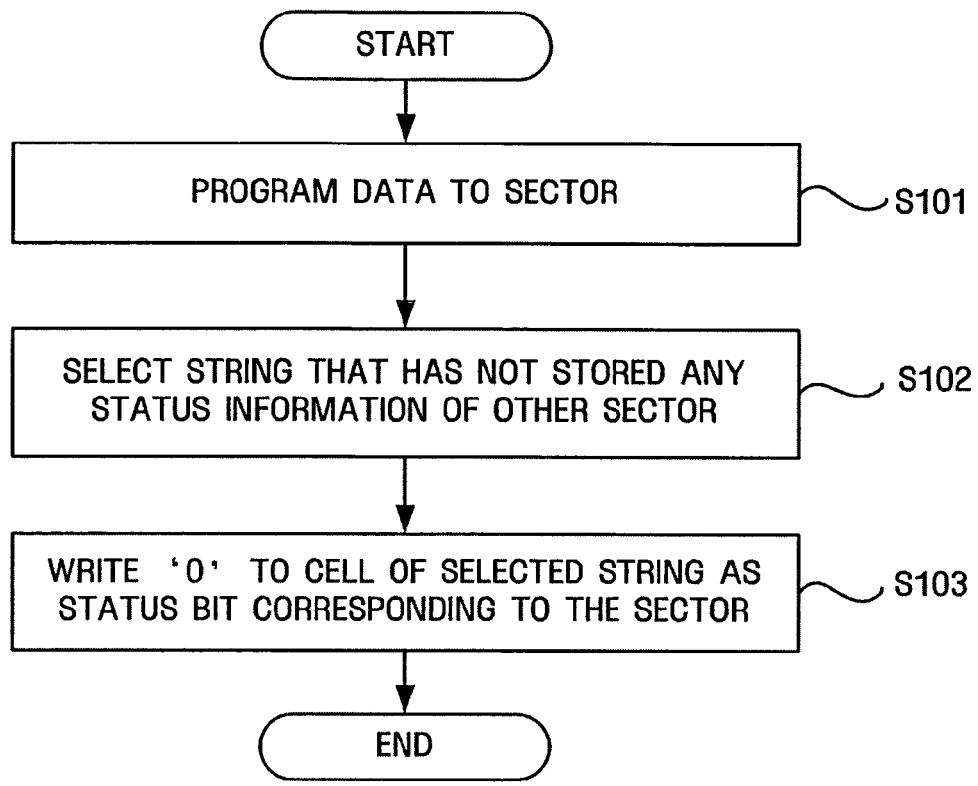
FIG. 9 is a flowchart of a procedure for storing data and storing status information in a cell of one string, according to a non-limiting embodiment of the present invention.

FIG. 9 is a flowchart of a procedure for storing data and storing status information in a cell of one string, according to a non-limiting embodiment of the present invention.

In operation S101, data is programmed to (or stored in) a sector in flash memory. In operation S102, a cell of a string to store status information on the sector is selected. Here, a cell is selected from a string that does not include any cell that has stored status information on another sector. In other words, cell selection is performed such that only one cell in a single string stores status information on a single sector. In operation S103, status information of 0 indicating that the data has been programmed to the sector is written to the selected cell. When data is programmed to another sector, status information is also stored through the procedure illustrated in FIG. 9. Accordingly, status information on one sector is provided through one cell included in one string. What string or cell will be selected may be different according to different non-limiting embodiments. Preferably, a cell included in the same page as a sector storing data may be selected. As described above, cells to store status information on different sectors may be selected along a diagonal direction.

Figure 10:
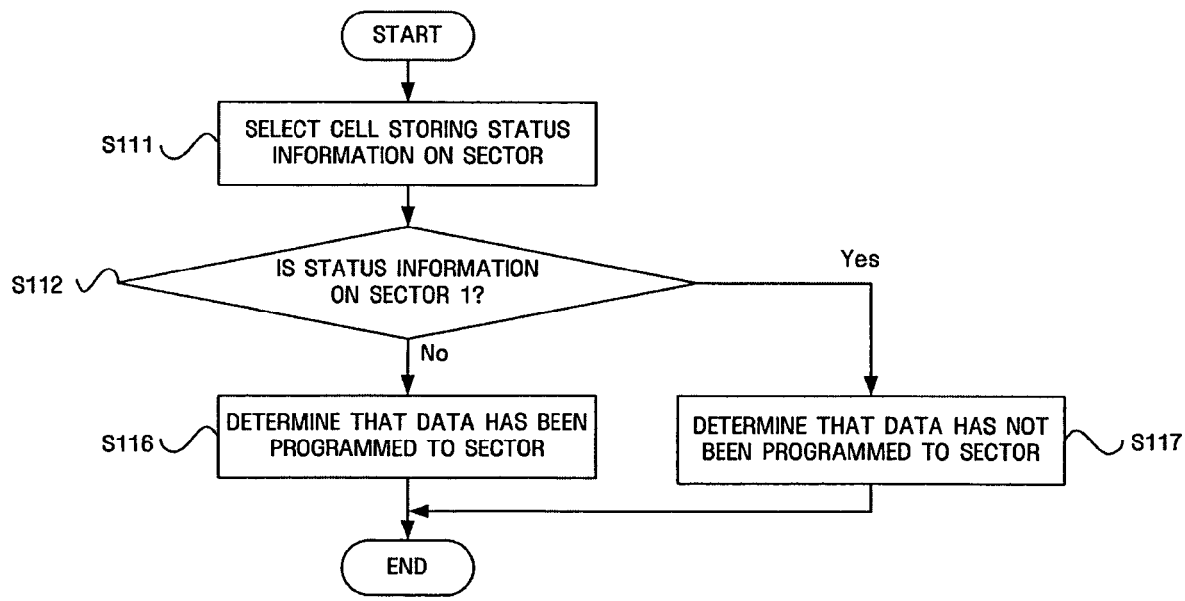
FIG. 10 is a flowchart of a procedure for verifying validity of a sector according to a non-limiting embodiment of the present invention.

FIG. 10 is a flowchart of a procedure for verifying validity of a sector according to a non-limiting embodiment of the present invention. In operation S111, a cell storing status information on a sector is selected using the manner used to select a cell to store status information in the procedure illustrated in FIG. 9. In operation S112, it is determined whether the status information stored in the selected cell is 1. If it is determined that the status information is not 1, it is determined that data has been programmed to the corresponding sector in operation S116. However, if it is determined that the status information is 1, it is determined that data has not been programmed to the corresponding sector in operation S117.

In the non-limiting embodiments illustrated in FIGS. 9 and 10, a status bit of 0 indicates that data has been programmed. However, in other non-limiting embodiments, it may be set that a status bit of 1 indicates that data has been programmed according to a type of memory device. Alternatively, when a multi-level cell is used, multiple status bits such as 00 or 11 may be used.

Figure 11:
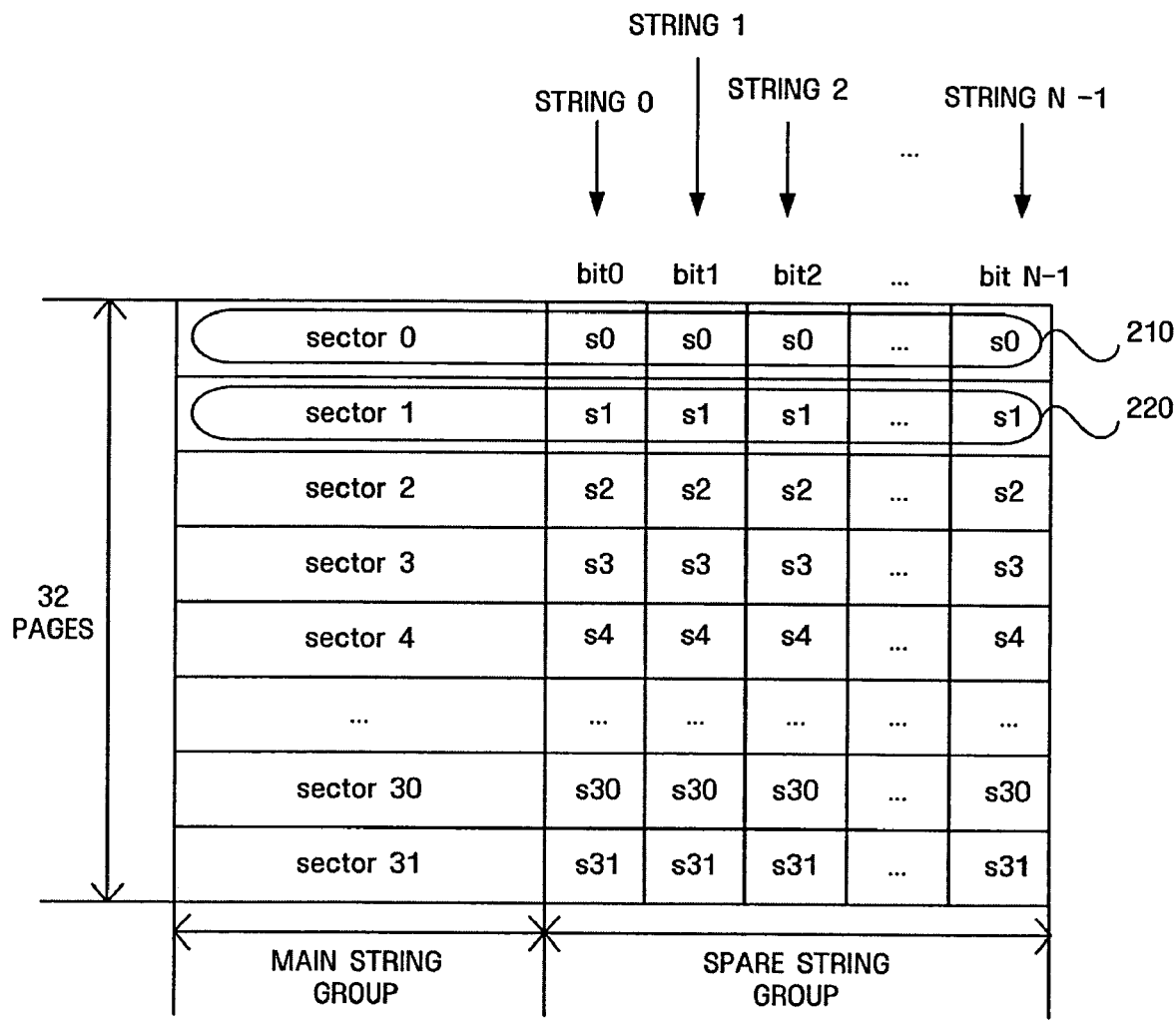
FIG. 11 illustrates small-block flash memory in which status information is stored using a plurality of cells to eliminate an error occurring when data is programmed, according to a non-limiting embodiment of the present invention.

FIG. 11 illustrates a small-block flash memory in which status information is stored using a plurality of cells to eliminate an error occurring when data is programmed, according to a non-limiting embodiment of the present invention.

For clarity of the description, flash memory is illustrated in a table form like that shown in FIG. 6 or 8. Usually, nonvolatile memory such as flash memory specifies the number of bits (or cells) that may fail in one page. When a single cell stores one bit of data, the number of bits that may fail in one page corresponds to the number of cells that may fail in one page. When a single cell stores multiple bits of data, the number of bits that may fail in one page may be different according to the number of cells that may fail in one page. Accordingly, when status information is stored taking into account the number of bits that may fail in one page, the status information can correctly provide whether an error has occurred while data is programmed.

As shown in FIG. 11, a single sector exists in one page in the small-block flash memory. After data is programmed to sector 0 included in a first page 210, data of 0 is programmed to cells included in the first page 210 among cells included in N spare strings. Status information on the sector 0 is represented by "s0" and is duplicately stored in multiple cells. In this case, even when an error occurs in status information stored in one cell of a page and the status information erroneously indicates that data has stored in a corresponding sector, if status information stored in other cells of the page correctly indicate that data has not been stored in the corresponding sector, it will be correctly determined that data has not been stored.

Assumption is made that status information of "1" indicates that data has not been programmed and status information of "0" indicates that data has been programmed. When data is stored in the sector 0 of the first page 210 and then status information is set to 0 to indicate that the data has been stored in the sector 0, some of cells (s1) included in a second page 220 may be set to 0. For example, status information s1 corresponding to bit 0 in string 0 may change from 1 to 0.

If status information is represented using only one cell or bit using a conventional method, it will be incorrectly determined that data has been stored in the second page 220. However, if status information is represented using N cells respectively included in N strings according to the non-limiting embodiments of the present invention, it will be correctly determined that data has not been stored in the second page 220 even when an error occurs in one cell among the N cells. In other words, even when the status information s1 in the string 0 erroneously changes to 0, since all status information s1 in strings 1 through N−1 has a value of "1," correct determination that data has not been stored in the second page 220 can be made.

When it is specified that K bits (or cells) may fail in one page, an error may be avoided by represent status information using N strings where N is greater than K. For example, when the number of bits that may fail in one page is 2, 5 bits may be used to represent status information. In this case, even when all of the two bits have an error, the other 3 bits provide correct status information. Accordingly, whether data has been stored can be correctly determined. When cells respectively included in N strings are used to represent status information, the number of cells having the same status information does not need to be N in a verification operation.

When the number of cells having the same status information is less than N but is greater than the number of cells that may fail, determination can be made based on the part of the cells having the same status information. For example, assuming that same status information is stored in a total of 10 cells and an average or a maximum of 2 cells may fail in one page, if 9 cells among the 10 cells store the same status information, it may be detected that one cell has an error and whether data has been stored may be determined from the status information stored in the 9 cells.

Figure 12:
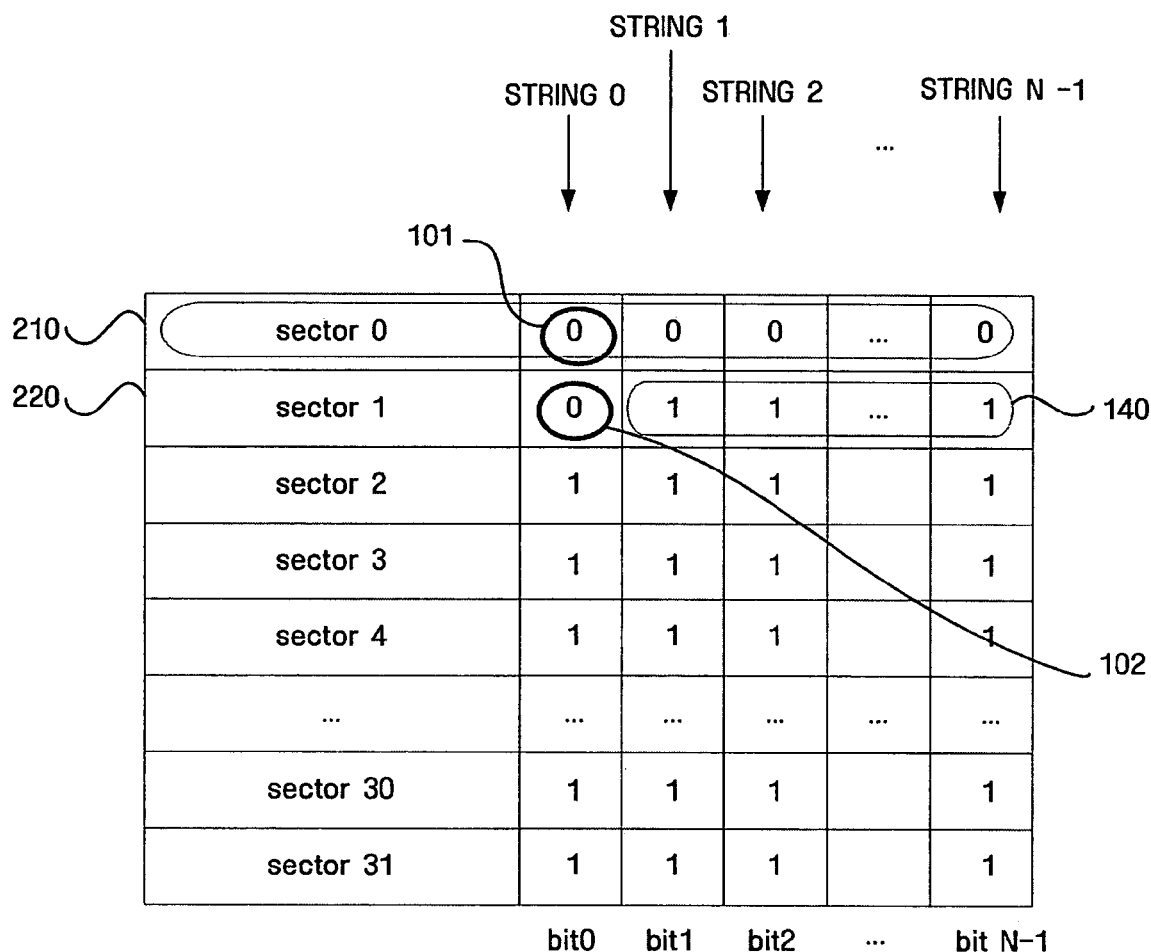
FIG. 12 illustrates a state where the status information is stored in the small-block flash memory according to the non-limiting embodiment illustrated in FIG. 11.

FIG. 12 illustrates a state where the status information is stored in the small-block flash memory according to the non-limiting embodiment illustrated in FIG. 11. After data is stored in the sector 0 of the first page 210, values of N bits (or cells) are changed into 0. At this time, a value of a cell 102 included in the string 0 may be changed from 1 to 0. However, since values of other cells 140 storing status information on sector 1 of the second page 220 are 1, it is determined that the sector 1 of the second page 220 has not been programmed.

Figure 13:
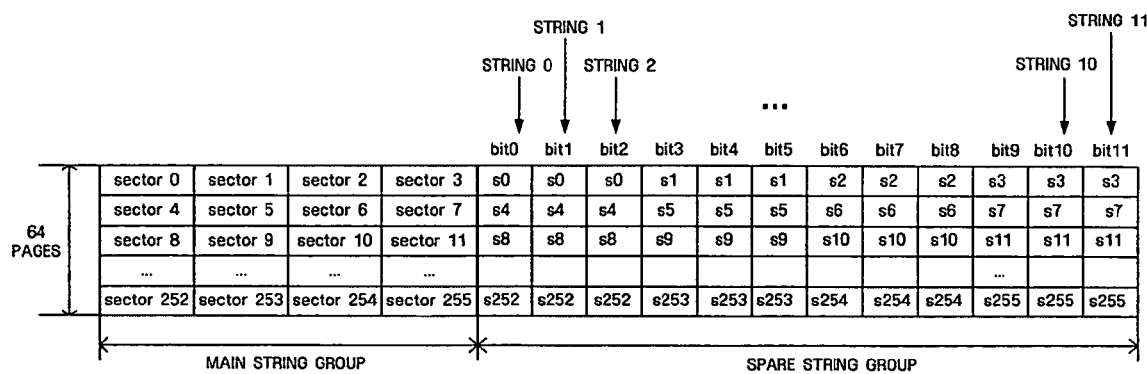
FIG. 13 illustrates a large-block flash memory in which status information is stored using a plurality of cells to eliminate an error occurring when data is programmed, according to a non-limiting embodiment of the present invention.

FIG. 13 illustrates large-block flash memory in which status information is stored using a plurality of cells to eliminate an error occurring when data is programmed, according to a non-limiting embodiment of the present invention.

Each page includes four sectors and status information is represented using 3 bits. Accordingly, a total of 12 bits are used to store status information on one page. When a single cell represents one bit, a total of 12 strings are used. When status information is stored in a cell included in a string, a value of another cell included in the string may be changed. However, since three cells are used to store status information on one sector, whether data has been stored in the sector can be correctly determined based on the remaining two cells.

Figure 14:
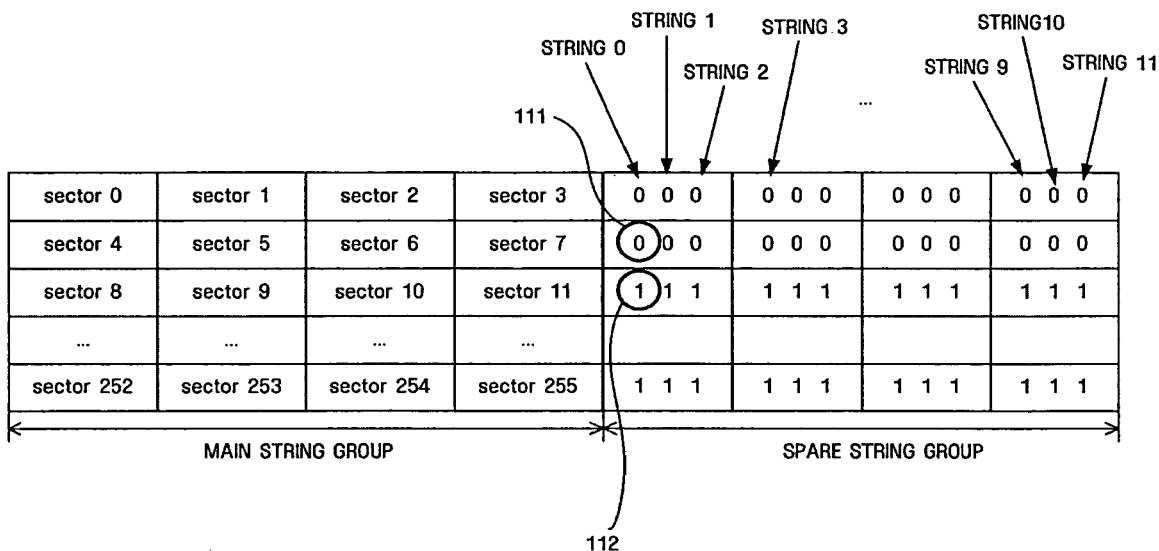
FIG. 14 illustrates a state where the status information is stored in the large-block flash memory according to the non-limiting embodiment illustrated in FIG. 13.

FIG. 14 illustrates a state where the status information is stored in the large-block flash memory according to the non-limiting embodiment illustrated in FIG. 13. Since status information on a sector is represented using 3 bits and four sectors exist in one page, status information on one page is represented using a total of 12 bits. When a single cell represents one bit, a total of 12 strings among spare strings are used to represent status information. As illustrated in FIG. 14, status information on sector 0 is stored in first cells of strings 0, 1, and 2. Status information on sector 1 is stored in first cells of strings 3, 4, and 5. In this way, status information on each sector is stored in three cells. Status information on sector 4 is stored in second cells of the same strings as those, i.e., the strings 0, 1, and 2 in which the status information on the sector 0 is stored.

FIG. 14 illustrates a state where data has been stored in sectors 0 through 7 corresponding to two pages. When a cell 111 of the string 0 is programmed as 0 to store the status information on the sector 4, a cell 112 of the string 0 may be erroneously programmed as 0. The cell 112 of the string 0 is for storing status information on sector 8. In the conventional method, whether data has been stored in the sector 8 is determined based on only the cell 112. However, in the non-limiting embodiments of the present invention, determination is made that data has been stored in the sector 8 only when all of third cells of the strings 0, 1, and 2 have the value of 0. Accordingly, even when the third cell 112 of the string 0 is erroneously programmed, it is correctly determined that data has not been stored in the sector 8.

In addition, since more bits than bits that may fail in each page are used to store status information on each sector, a probability that all status information on each sector is incorrect is very low. For example, when a maximum of two bits may fail in each page, three bits may be used to store status information on each sector, as illustrated in FIG. 13. Even when two bits of three bits storing status information on a sector are erroneously changed to 0, the remaining one bit still has the value of 1, and therefore, it is correctly determined that data has not been stored in the sector.

Figure 15:
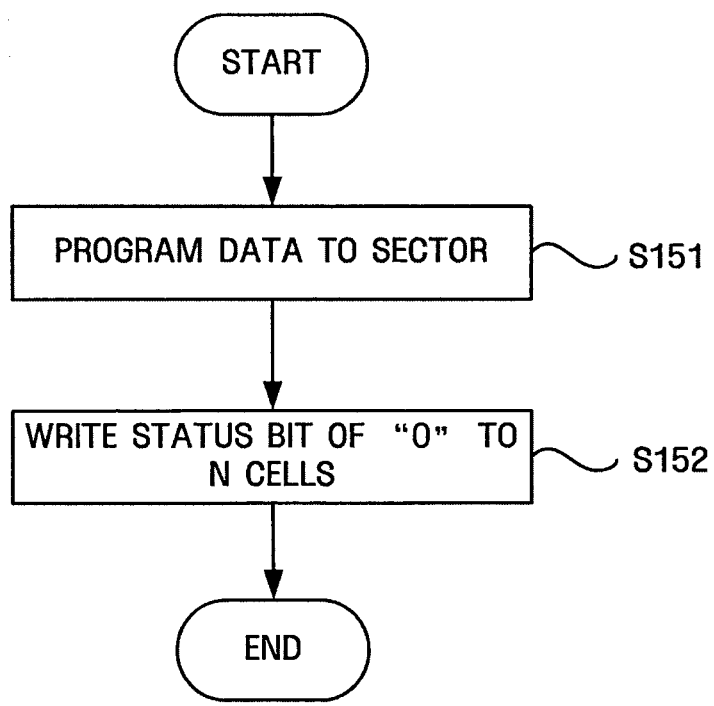
FIG. 15 is a flowchart of a procedure for storing data and storing status information in a plurality of cells, according to a non-limiting embodiment of the present invention.

FIG. 15 is a flowchart of a procedure for storing data and storing status information in a plurality of cells, according to a non-limiting embodiment of the present invention. In operation S151, data is programmed to a sector. In operation S152, a status bit of "0" is written to N cells in spare strings included in a page corresponding to the sector. Accordingly, status information on the sector is stored in the N cells.

Figure 16:
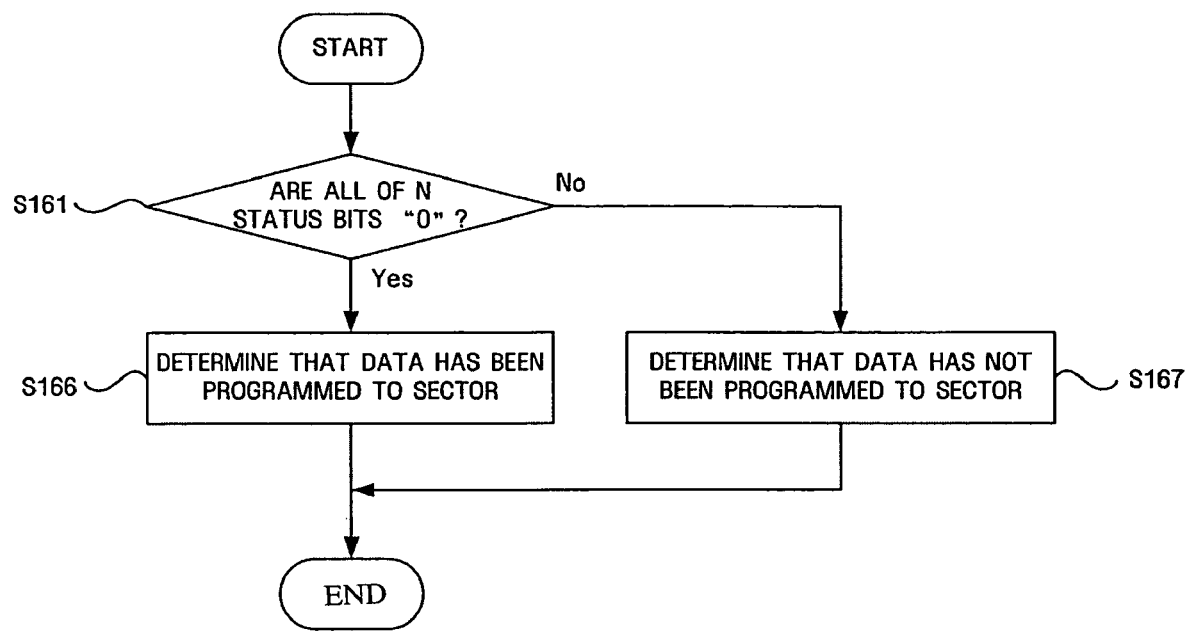
FIG. 16 is a flowchart of a procedure for verifying validity of a sector using multiple status bits, according to a non-limiting embodiment of the present invention.

FIG. 16 is a flowchart of a procedure for verifying validity of a sector using multiple status bits, according to a non-limiting embodiment of the present invention. In operation S161, it is determined whether N status bits corresponding to a sector are 0. If there is no error, all of the N status bits will be 0 when data has been programmed to the sector or will be 1 when data has not been programmed to the sector. In operation S166, it is determined that data has been stored in the sector when all of the N status bits are 0. However, in operation S167, it is determined that data has not been programmed to the sector when all of the N status bits are not 0, that is, when some of the N status bits are 0 or all of the N status bits are 1. Some of the N status bits are 0 when an error has occurred while status information on another sector is stored. However, other bits among the N status bits hold the value of 1, and therefore, it is correctly determined that data has not been stored in the sector.

It is just an exemplary embodiment to determine whether all of the N status bits are 0. As illustrated in FIG. 11, even when only some of the N status bits are 0, if it is determined that the number of N status bits of "0" is sufficient to represent correct status information as a result of being compared with the number of bits that may fail in one page, it is determined that data has been programmed. For example, when assuming that status information on a sector is stored in a total of 10 cells and it is specified that an average or a maximum of 2 cells may fail in one page, if 9 cells among the 10 cells store the same status information, it is detected that an error has occurred in the other one cell and whether data has been stored in the sector is determined based on the status information stored in the 9 cells. According to the characteristics of elements constituting memory, a determination may be made that data has been programmed only when all of N cells have the same status information or when at least about 90% of the N cells has the same status information.

Figure 17:
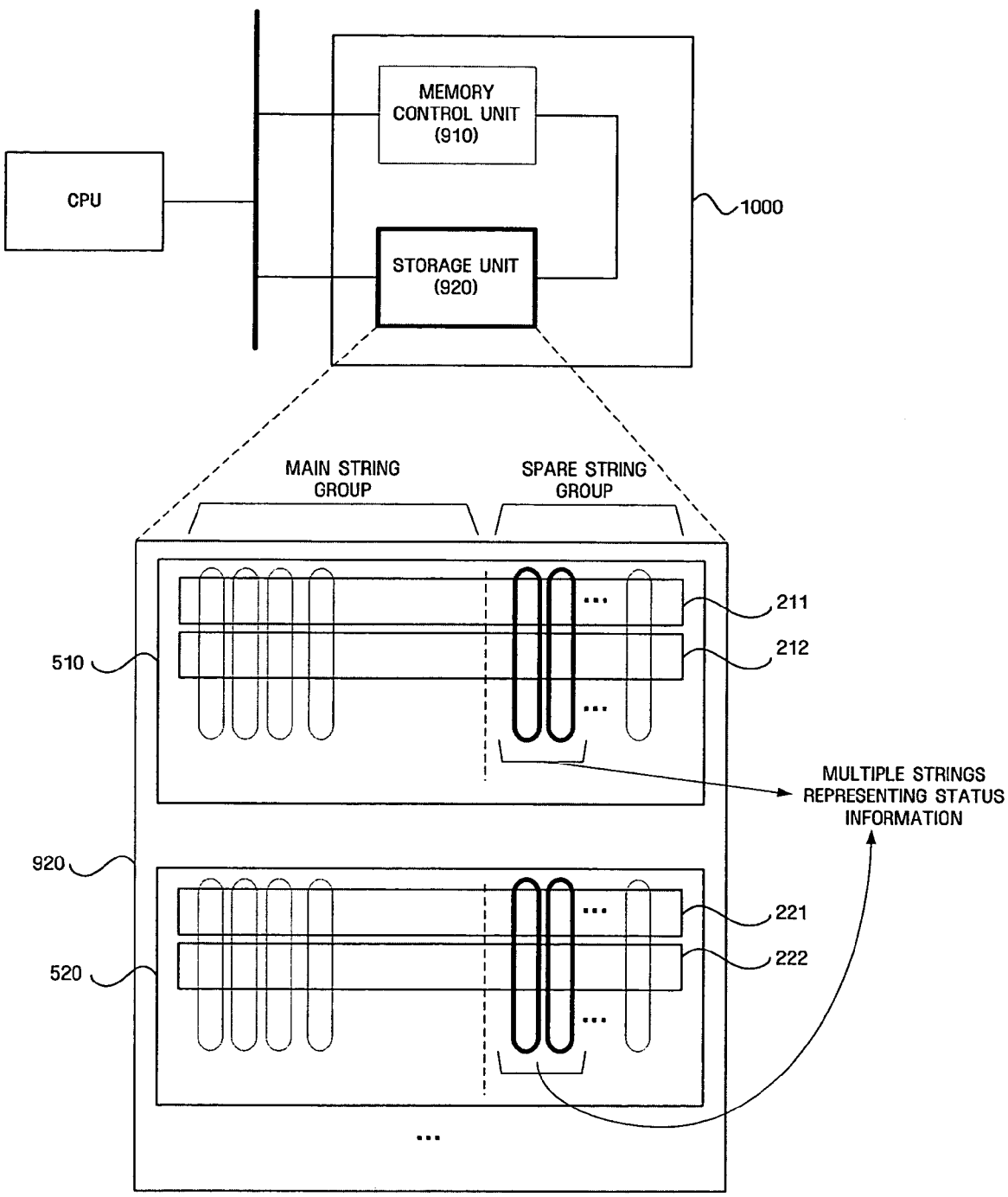
FIG. 17 illustrates a nonvolatile memory device for storing status information in a plurality of strings, according to a non-limiting embodiment of the present invention.

FIG. 17 illustrates a nonvolatile memory device 1000 for storing status information in a plurality of strings, according to a non-limiting embodiment of the present invention.

The term 'module', as used herein according to embodiments of the invention, means, but is not limited to, a software or hardware component, such as a Field Programmable Gate Array (FPGA) or Application Specific Integrated Circuit (ASIC), which performs certain tasks. A module may advantageously be configured to reside on the addressable storage medium and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. In addition, the components and modules may be implemented such that they execute one or more computers in a communication system.

The nonvolatile memory device 1000 includes a memory control unit 910 and a storage unit 920. The memory control unit 910 controls which data to be read from or written to the storage unit 920. In addition, when the nonvolatile memory device 1000 is a flash memory device, the memory control unit 910 controls an erase operation before writing data. The memory control unit 910 also determines an area in the storage unit 920 in which status information on a sector or page will be stored while writing (or programming) data to the sector or the page. For example, when a single independent bit per one string is used to store status information on one sector, the memory control unit 910 selects a string in which status information on a sector or page will be stored. When status information on one sector or page is stored using multiple cells, the memory control unit 910 determines the number of cells allocated for the status information such that the number of bits for the status information is greater than the number of bits that may fail in one page.

The storage unit 920 is an area in which data is stored and includes a plurality of blocks 510 and 520 each of which includes a plurality of pages. The block 510 includes pages 211 and 212 and the block 520 includes pages 221 and 222. Cells respectively included in different pages form a string. Strings are classified into a main string group and a spare string group. Data is programmed to cells included in the main string group. At least two strings included in the spare string group are used to store status information on a page or a sector. In FIG. 17, strings providing status information are outlined bold. Since at least two strings are used to store status information, an error that may occur in one string does not influence another string. As a result, a status information error can be overcome.

The memory control unit 910 determines whether to use an independent bit or multiple bits to store status information on each sector or page. When many spare strings exist, an independent bit is used. When spare strings are not many, multiple bits are used. When an independent bit is used to store status information on each sector or page, many strings may be needed in proportion to the number of pages or sectors. Contrarily, when multiple N bits are used to store status information on each sector or page, only N strings are needed. Accordingly, the number of strings allocated for status information may be reduced.

According to the present invention, status information may be stored using cells included in multiple strings.

In addition, when the status information is stored in one string, another string is not influenced, so that an error occurring when data is stored can be reduced.

It will be apparent to those skilled in the art that various modifications and changes may be made thereto without departing from the scope and spirit of the invention. Therefore, it should be understood that the above non-limiting embodiments are not restrictive but illustrative in all aspects. The scope of the present invention is defined by the appended claims rather than the detailed description of the invention. All modifications and changes derived from the scope and spirit of the claims and equivalents thereof should be construed to be included in the scope of the present invention.

What is claimed is:

1. A nonvolatile memory for storing status information using multiple strings, the nonvolatile memory comprising:
   a cell capable of storing at least one bit of data;
   a plurality of strings, each string having at least two cells connected in series; and
   a plurality of pages each of which includes a plurality of cells,
   wherein the plurality of strings comprise a main string group comprised of strings storing data and a spare string group including at least two spare strings that store status information on the data stored in the main string group.

2. The nonvolatile memory of claim 1, wherein each of the spare strings comprises one cell storing the status information and a plurality of cells that do not store the status information.

3. The nonvolatile memory of claim 1, wherein each of the plurality of pages comprises a plurality of sectors, and each of the spare strings comprises one cell storing status information on at least one sector among the plurality of sectors and a plurality of cells that do not store the status information.

4. The nonvolatile memory of claim 1, wherein whether one of the plurality of pages has stored data is determined based on a value of a cell storing status information on the one page among cells included in the one page within the spare string group.

5. The nonvolatile memory of claim 1, wherein at least some of the plurality of cells included in each page within the spare string group store same status information on the respective page.

6. The nonvolatile memory of claim 5, wherein when a plurality of cells have a same value among cells storing status information on each page, a determination is made that data has been stored in the respective page.

7. The nonvolatile memory of claim 1, wherein the nonvolatile memory comprises a flash memory.

8. The nonvolatile memory of claim 7, wherein the flash memory is one of a NAND flash memory and an AND flash memory.

9. A nonvolatile memory device for storing status information using multiple strings, the nonvolatile memory device comprising:

a nonvolatile storage unit comprising a cell capable of storing at least one bit of data, a plurality of strings, each string having at least two cells connected in series, and a plurality of pages each of which includes a plurality of cells; and a memory control unit selecting a cell to store the data in the nonvolatile storage unit, wherein the memory control unit controls such that the plurality of strings comprise a main string group comprised of strings storing data and a spare string group including at least two spare strings that store status information on the data stored in the main string group.

10. The nonvolatile memory device of claim 9, wherein each of the spare strings comprises one cell storing the status information and a plurality of cells that do not store the status information.

11. The nonvolatile memory device of claim 9, wherein each of the plurality of pages comprises a plurality of sectors, and each of the spare strings comprises one cell storing status information on at least one sector among the plurality of sectors and a plurality of cells that do not store the status information.

12. The nonvolatile memory device of claim 9, wherein the memory control unit determines whether each respective page has stored data based on a value of a cell storing status information on the respective page within the spare string group.

13. The nonvolatile memory device of claim 9, wherein the memory control unit stores same status information on each respective page in at least some of the plurality of cells included in the page within the spare string group.

14. The nonvolatile memory device of claim 13, wherein when a plurality of cells has a same value among cells storing status information on the page, a determination is made that data has been stored in the respective page.

15. The nonvolatile memory device of claim 9, wherein the nonvolatile memory comprises a flash memory.

16. The nonvolatile memory device of claim 9, wherein the flash memory is one of a NAND flash memory and an AND flash memory.

17. A method of storing status information using multiple strings, the method comprising:

receiving data and address information for storing the data;

storing the data in a cell corresponding to the address information within a main string group;

selecting a cell from a spare string group to store status information on a page including the cell storing the data; and storing the status information on the page in the selected cell, wherein the spare string group comprises at least two strings each of which comprises a cell storing status information on data stored in the main string group.

18. The method of claim 17, wherein the cell selected from the spare string group is capable of storing at least one bit of data, each of the strings comprises at least two cells connected in series, and the page is a set of cells whose control gates are connected to each other.

19. The method of claim 17, wherein the storing of the status information comprises performing the storing such that only one cell storing the status information exists in each string.

20. The method of claim 17, wherein the page comprises a plurality of sectors, and the storing of the status information comprises performing the storing such that only one cell storing status information on one of the sectors exists in each string.

21. The method of claim 17, further comprising determining whether the page has stored the data based on a value of the cell storing the status information on the page.

22. The method of claim 17, wherein the storing of the status information comprises storing the same status information in at least some of cells included in the multiple strings.

23. The method of claim 22, wherein when a plurality of cells have a same value among the cells storing the status information on the page, a determination is made that the data has been stored in the page.

* * * * *